(12) United States Patent
Frosien

(10) Patent No.: US 6,429,427 B1
(45) Date of Patent: Aug. 6, 2002

(54) METHOD AND APPARATUS FOR SURFACE IMAGING

(75) Inventor: Jurgen Frosien, Riemerling (DE)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 09/538,886

(22) Filed: Mar. 30, 2000

(30) Foreign Application Priority Data

Mar. 31, 1999 (EP) ............................................. 99106654

(51) Int. Cl.$^7$ ............................................. H01J 37/256
(52) U.S. Cl. ........................ 250/310; 250/311; 250/306
(58) Field of Search ................................ 250/307, 308, 250/311, 370

(56) References Cited

U.S. PATENT DOCUMENTS 3,736,422 A * 5/1973 Weber et al. .............. 250/49.5
5,668,372 A * 9/1997 Iwabuchi et al. ........... 250/310
6,084,238 A * 7/2000 Todokoro et al. ........... 250/310

* cited by examiner

Primary Examiner—Jack Berman
Assistant Examiner—Kalimah Fernandez
(74) Attorney, Agent, or Firm—Muramatsu & Associates

(57) ABSTRACT

A method and an apparatus for surface imaging, whereby the surface of a specimen is scanned by a primary particle beam and the secondary and/or backscattered particles released at the surface are detected by a detector. The surface imaging apparatus includes a charge electrode in the region of the surface to be imaged which are supplied with a variable voltage in order to establish a constant surface potential on the specimen. The variable voltage is produced with use of an output voltage of the detector and is registered in synchronism with the position of the primary particle beam for generating an image of the surface.

7 Claims, 2 Drawing Sheets

METHOD AND APPARATUS FOR SURFACE IMAGING

FIELD OF THE INVENTION

The invention relates to a method and an apparatus for surface imaging, wherein the surface is scanned by a primary particle beam and secondary and/or back-scattered particles released at the surface are detected by a detector.

BACKGROUND OF THE INVENTION

Such methods and apparatus are used, for example, for undistorted surface imaging and critical dimension measurement in particle beam systems and especially in the semiconductor industry.

In order to guarantee high yield and reliable electrical specifications, integrated circuits have to be manufactured within tight dimensional tolerances. Therefore, each manufacturing step is controlled in a particle beam apparatus, mainly a scanning electron microscope, regarding process quality and critical dimension tolerances. Today's devices with 0.18 µm design rules already require a critical dimension measurement accuracy in the lower nanometer range.

Since integrated circuit process layers, which have to be inspected, are formed from electrical insulation material (e.g. resist layers), electrical charging during the surface imaging with the particle beam may cause problems regarding beam distortion. Such surface charging may not only generate artifacts in the image contrast but can also result in dimensional distortions of the structures to be measured. This may cause measurement errors in critical dimension measurements of several nanometers, which even may reach several tens of nanometers.

Today's process inspection and critical dimension measurement equipment uses high performance low voltage secondary electron microscopes. Low voltages are supplied in the range of 0.5–2 keV to minimize charging effects that cause inaccuracy in structure imaging by distorting the image profile of secondary electrons. Charging effects become more serious for insulator targets, since no current flow is allowed within the materials.

FIG. 2 shows a typical yield curve for an insulating material. As the primary electron energy increases, the total yield increases until a maximum is reached and then decreases gradually. Two operating points E1 and E2 exist at which the total yield becomes 1, which means that the number of incoming primary electrons and the number of escaping secondary and backscattered electrons is the same:

$$i_{PE} = i_{SE} + i_{BSC}$$

Usually, point E2 is preferably selected as the operating condition to avoid charging accumulation. In practice, however, this compensation effect can only be achieved on average for a major surface area, because the secondary electron yield depends not only on the material but also on the local shape, especially the tilt angle of the pattern to be measured:

SE-yield (tilt angle α)=SE-yield (α=0)/cos α

Consequently, there is a local charging effect which is demonstrated in FIG. 3. The pattern shown in FIG. 3 has a side-wall angle α. After scanning of such a pattern, the following charge distribution may be obtained at a certain primary beam energy: Positive charges are found mostly around the edge corners, while negative charges are distributed mainly on the top surfaces and along the side walls.

This local charging will, of course, influence (deflect) the primary particle beam and will consequently generate image artifacts and measurement errors in critical dimension measurement.

SUMMARY OF THE INVENTION

The object of the invention is to improve the method and apparatus for surface imaging by minimizing the influence of the local charging effect.

This object is achieved according to the invention in that there are means provided in the region of the surface to be imaged which are supplied with a variable voltage in order to establish a constant surface potential. The variable voltage is then used for image generation of the surface.

Usually, the detector signal is used for image generation. However, the detector output signal according to the invention is kept constant by controlling the variable voltage. Accordingly, the variable voltage is used for image generation.

BRIEF DESCRIPTION OF THE DRAWINGS

Further advantages and embodiments of the invention will be explained in greater detail with reference to the description of an embodiment and the drawings, in which.

DETAILED DESCRIPTION OF THE INVENTION

Figure 1:
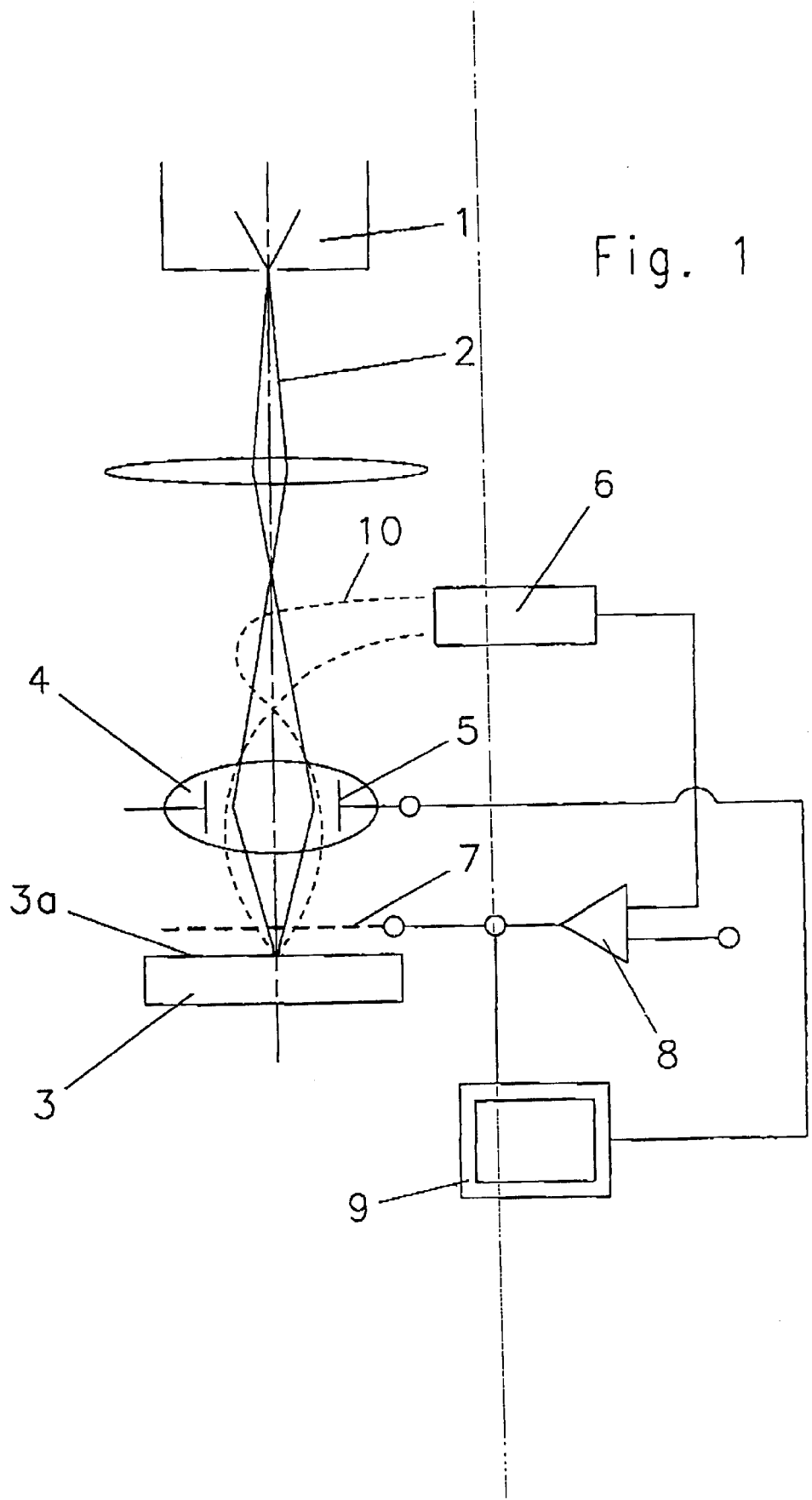
FIG. 1 shows a schematic representation of an apparatus for surface imaging.

FIG. 1 shows an apparatus for surface imaging comprising a source 1 to generate a primary particle beam 2 which is focussed on the surface 3a of a specimen 3 by an objective lens 4. The source 1 is preferably a field or thermal field emission source for producing a low voltage electron beam. Furthermore, there is a condenser lens system for demagnifying the source image. The objective lens is preferably realized by a single pole lens or a combined magnetic electrostatic retarding field lens. However, every other kind of objective lens can be realized. Deflection means 5 are used to scan the primary particle beam across the surface 3a. The secondary and/or backscattered particles released at the surface 3a are detected by detection means (detector) 6 which are normally in-lens or pre-lens detectors.

Of course, the particle beam apparatus comprises further elements for beam alignment, stigmatism and aperture angle limitation which are not shown in FIG. 1.

To overcome the local surface charging, a charge control electrode 7 is provided which is arranged close to the surface 3a and can be supplied with a variable voltage which is controlled by control means 8 so that the detector output signal is kept constant by controlling the variable voltage.

Finally, there are means 9 for generating an image of the surface 3a by registration of the variable voltage in synchronism with the position of the primary particle beam. Accordingly, the means for generating an image of the surface is connected to the deflection means 5 and to the charge control electrode 7.

The imaging process will now be described in more detail:

The surface charging (surface potential) is adjusted in a flat portion of the specimen 3. Control parameters are:

the primary beam energy (which is then fixed at a predetermined value) and the voltage of the charging control electrode by means of a reference value at the control means (differential amplifier) 8.

Figure 2:
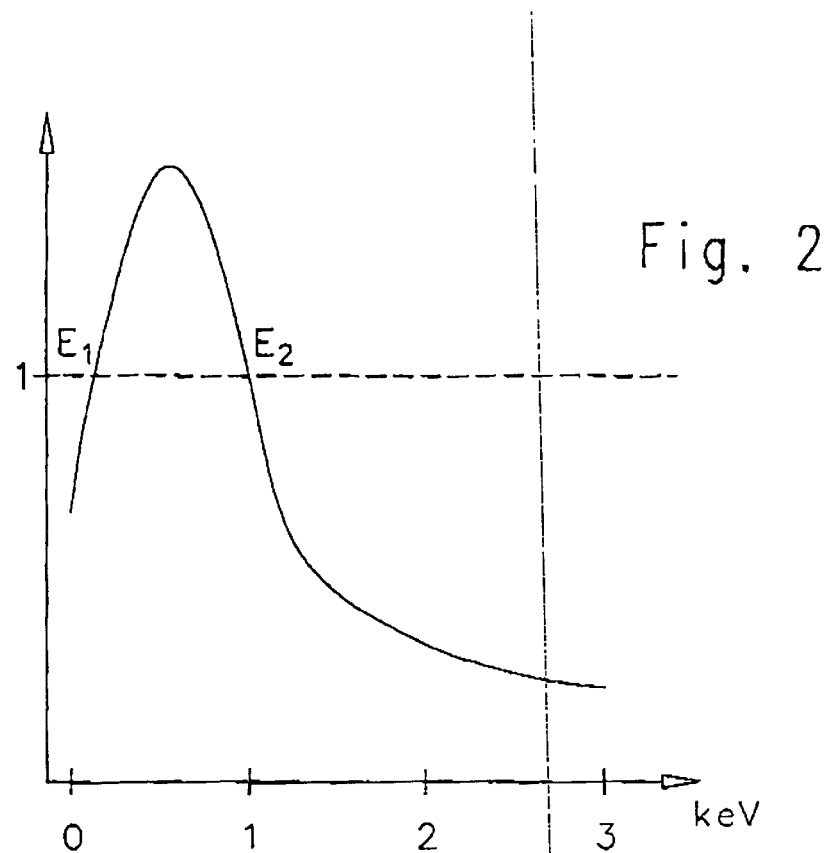
FIG. 2 shows a typical yield curve of an insulated pattern.
Figure 3:
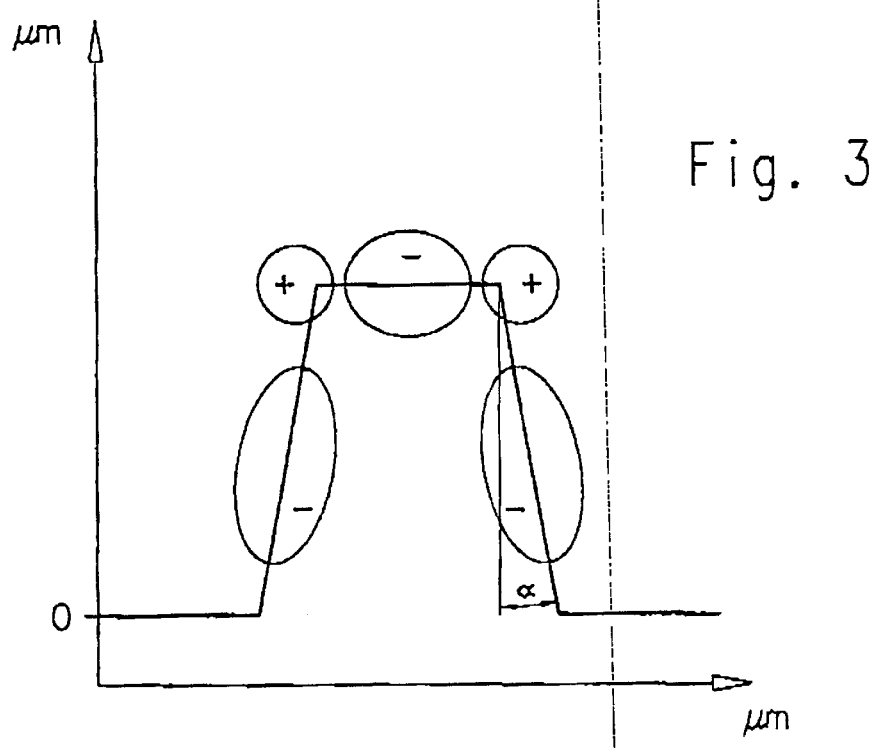
FIG. 3 shows the charge distribution of an insulated pattern.

The primary beam energy is selected so that the surface 3a tends to charge positively. According to FIG. 2, the primary beam energy is selected slightly to the left of point E2.

The bias voltage of the charge control electrode 7 is slightly negative, in order to force particles released at the surface 3a to return to their origin. By changing the voltage of the charge control electrode 7, the surface charge can be adjusted via the amount of returning secondary or backscattered particles. If the charge control electrode 7 is more positive, more particles can be released at the surface 3a and the surface potential locally tends to become more positive. If the charge control electrode becomes more negative, the particles will return to the surface 3a and the local potential tends to become more negative.

By varying the voltage of the charge control electrode 7 in this manner, any potential (tolerated by the chosen primary beam energy) of the specimen can be selected. The surface potential is preferably kept at the voltage of the specimen, accordingly non-charging conditions will be used, but also other conditions (e.g. between −5 and +5 V, preferably between +1 and +3 V) can be used during this calibration. A positive surface charge improves the imaging of contact holes, for instance.

After this system setting, image generation by beam scanning can be performed. The electronic circuit is operated in a closed loop, which means that the detector output signal is kept constant by the control means 8 by controlling the charge control electrode 7. In the case where the surface 3a has a higher particle yield locally and tends to charge more positively in this region (which means a higher detector signal), the charge control electrode 7 is automatically controlled more negatively. This causes the particle emission in this location to be reduced and charging to a more positive surface potential to be prevented. For a local reduction in particle yield, the opposite procedure takes place and the potential of the charge control electrode 7 becomes more positive, which allows a higher particle escape probability.

Since the detector signal is kept constant by the method described above, the detector output signal is no longer suitable for surface image generation as in conventional particle beam apparatus. The method described above, therefore, registers the voltage of the charge control electrode 7 in synchronism with the position of the particle beam. The voltage of the charge control electrode 7 exactly records the changes in particle yield which characterizes the topography.

The above method guarantees the same charge balance in each location of the specimen, which results in an absence of local charge distributions including all the negative effects of local image distortions.

What is claimed is:

1. A method for surface imaging, whereby a surface of a specimen is scanned by a primary particle beam and secondary and/or backscattered particles released at the surface are detected by a detector, comprising the following steps of:

producing an output voltage from the detector which is responsive to the secondary and/or backscattered particles;

supplying a variable voltage to a charge electrode which is provided in a region of the surface to be imaged in order to establish a constant surface potential; and generating an image of the surface of specimen based on the variable voltage applied to the charge electrode;

wherein the variable voltage is created in such a way to maintain the output voltage of the detector constant.

2. A method according to claim 1, wherein the detector output signal is kept constant by controlling the variable voltage through a negative feedback loop.

3. A method according to claim 1, wherein the surface potential is kept close to the voltage of the specimen.

4. A method according to claim 1, wherein the surface potential is kept at a different voltage than the specimen.

5. A method according to claim 1, wherein the variable voltage is registered in synchronism with the position of the primary particle beam.

6. A method according to claim 1, wherein the primary particle beam energy is selected so that the surface tends to charge positively.

7. An apparatus for imaging a surface of a specimen, comprising:

a source to generate a primary particle beam;

deflection means for scanning the surface with the primary particle beam;

detection means for detecting secondary and/or backscattered particles and producing an output voltage in response to the secondary and/or backscattered particles;

a charge control electrode which is arranged in the region of the surface and which is supplied with a variable voltage in order to establish a constant surface potential where the variable voltage is produced in such a way to maintain the output voltage of the detection means constant; and means for generating an image of the surface by registering the variable voltage of the charge control electrode.

* * * * *